United States Patent [19]

Subramanian

[11] Patent Number: 5,539,776
[45] Date of Patent: Jul. 23, 1996

[54] ALL DIGITAL IF-TO-BASEBAND SIGNAL CONVERTER

[75] Inventor: Ravi Subramanian, Holmdel, N.J.

[73] Assignee: AT&T Corp., Murray Hill, N.J.

[21] Appl. No.: 158,118

[22] Filed: Nov. 24, 1993

[51] Int. Cl.[6] .................................................. H03D 3/22
[52] U.S. Cl. .......................... 375/283; 375/330; 329/306
[58] Field of Search ...................................... 375/106, 328, 375/330, 283, 333; 329/345, 346, 304, 306

[56] References Cited

U.S. PATENT DOCUMENTS

| | | | |
|---|---|---|---|
| 5,073,905 | 12/1991 | Dapper et al. | 375/106 |
| 5,122,758 | 6/1992 | Tomita | 375/84 |
| 5,313,170 | 5/1994 | Kojima | 375/328 |
| 5,376,894 | 12/1994 | Petranovich | 375/83 |

OTHER PUBLICATIONS

Isao Shimizu, et al., *New Digital Mobile Radio Technologies*, NTT Review, vol.4, No.1, Jan. 1992.

*Primary Examiner*—Stephen Chin
*Assistant Examiner*—Timothy J. May

[57] ABSTRACT

An intermediate frequency (IF) to baseband frequency signal converter for decoding an analog IF signal using phase information contained in the IF signal includes a first signal generator for generating an analog square wave signal from the IF signal. The signal converter also includes a second signal generator for generating a local phase reference signal, and a phase difference determinator for determining at a particular sampling interval a phase difference between a phase of the analog square wave signal and a phase of the local phase reference signal, wherein the phase difference represents a symbol which the signal converter has decoded from the IF signal.

7 Claims, 3 Drawing Sheets

5,539,776

ALL DIGITAL IF-TO-BASEBAND SIGNAL CONVERTER

BACKGROUND OF THE INVENTION

1. Field of the Invention

The present invention relates generally to communication receivers, and more particularly to intermediate frequency (IF) to baseband frequency signal converters for use in communication receivers.

2. Related Art

Recent advances in digital VLSI (Very Large Scale Integration) technology have been employed in communication receivers to achieve increased processing power and decreased power consumption. As will be appreciated, high processing power, low power consumption receivers are necessary to efficiently and effectively implement many types of communication systems, such as cellular telephone systems.

Conventional radio communication receivers and, specifically, the IF-to-baseband signal converters used therein employ analog-to-digital (A/D) converters to convert a received analog signal to a digital signal. Unfortunately, low-cost, low-power analog-to-digital signal conversion technology has benefited slowly from the advances in digital VLSI technology. This is the case, since mixed-signal CMOS and BiCMOS techniques do not allow for low-power analog signal conversion at low cost. Thus, the A/D converters and the associated analog I/Q (in-phase/quadrature) mixers which are employed in conventional communication receivers increase power consumption, complicate the design process (since analog designs are generally harder to test than digital designs), and increase production costs (since analog components must be tuned and/or matched).

Thus, what is required is an all digital IF-to-baseband signal converter which does not employ analog-to-digital (A/D) converters or other associated analog circuitry.

SUMMARY OF THE INVENTION

The present invention is directed to an intermediate frequency (IF) to baseband frequency signal converter for decoding an analog IF signal using phase information contained in the IF signal. The signal converter includes first means for generating an analog square wave signal from the IF signal, second means for generating a local phase reference signal, and third means, coupled to the first means and the second means, for determining at a particular sampling interval a phase difference between a phase of the analog square wave signal and a phase of the local phase reference signal, wherein the phase difference represents a symbol which the signal converter has decoded from the IF signal.

Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE FIGURES

The present invention will be described with reference to the accompanying drawings, wherein.

DETAILED DESCRIPTION OF THE PREFERRED EMBODIMENTS

Figure 1:
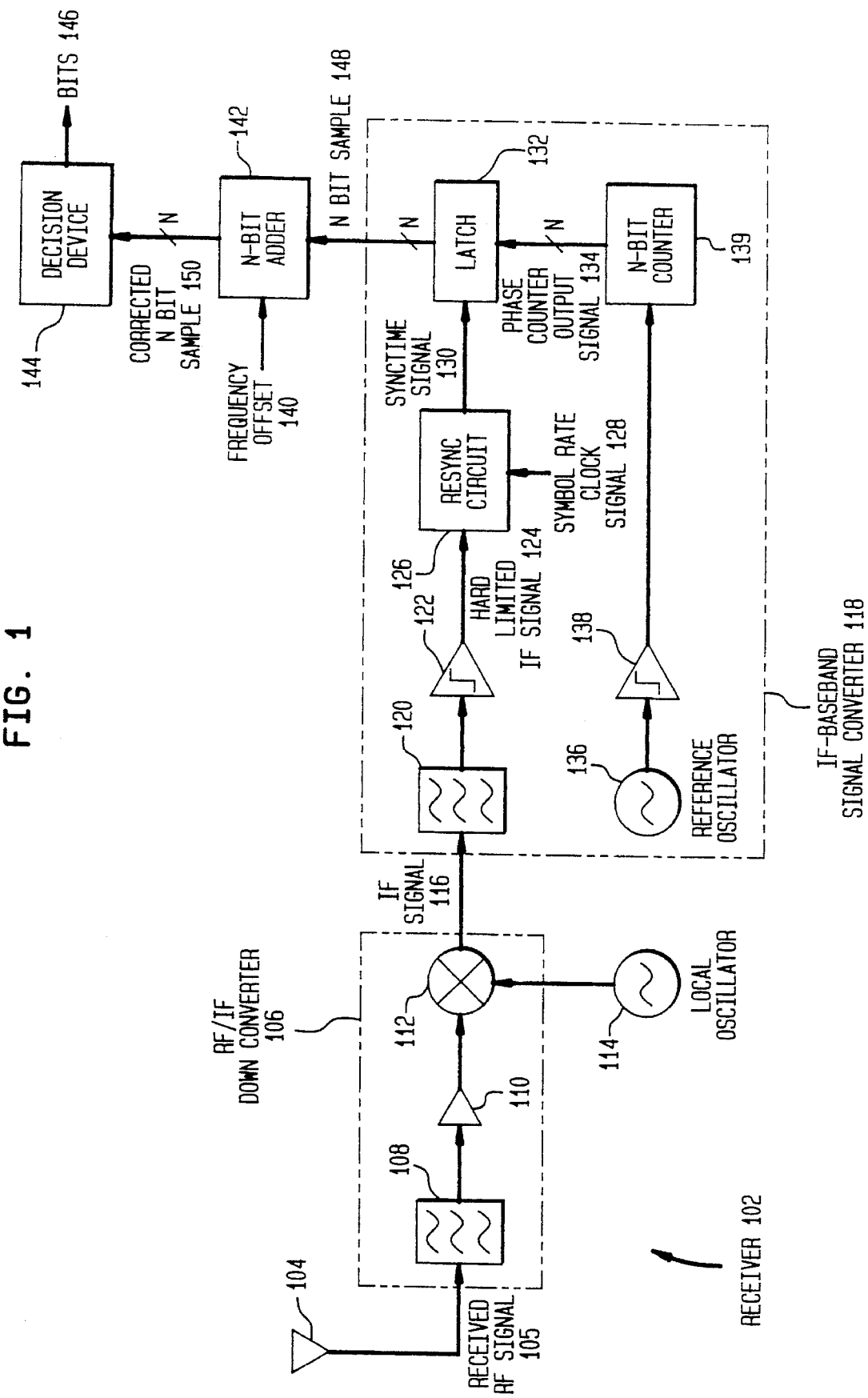
FIG. 1 is a block diagram of a communication receiver according to a preferred embodiment of the present invention.

FIG. 1 is a block diagram of a communication receiver 102 according to a preferred embodiment of the present invention. The receiver 102 includes an antenna 104 which receives a RF (radio frequency) signal that was transmitted by a transmitter device (not shown). The antenna 104 can be any well known RF antenna. The frequency of the RF signal is approximately 900 MHz to 1 GHz, although the receiver 102 of the present invention could operate with RF signals of other frequencies. The received RF signal is shown as 105 in FIG. 1.

Figure 2:
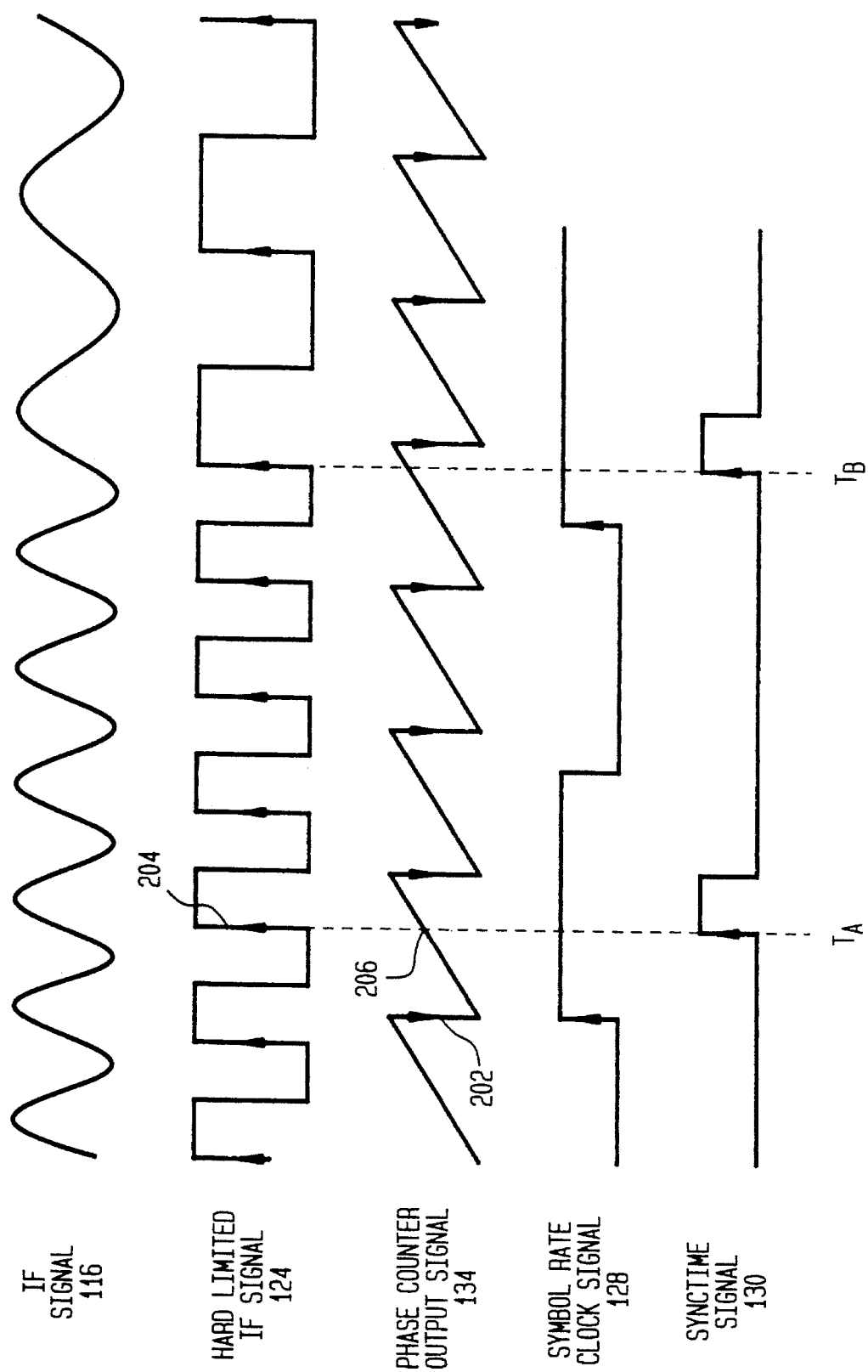
FIG. 2 shows example signals used for illustrating the operation of the present invention.
Figure 3:
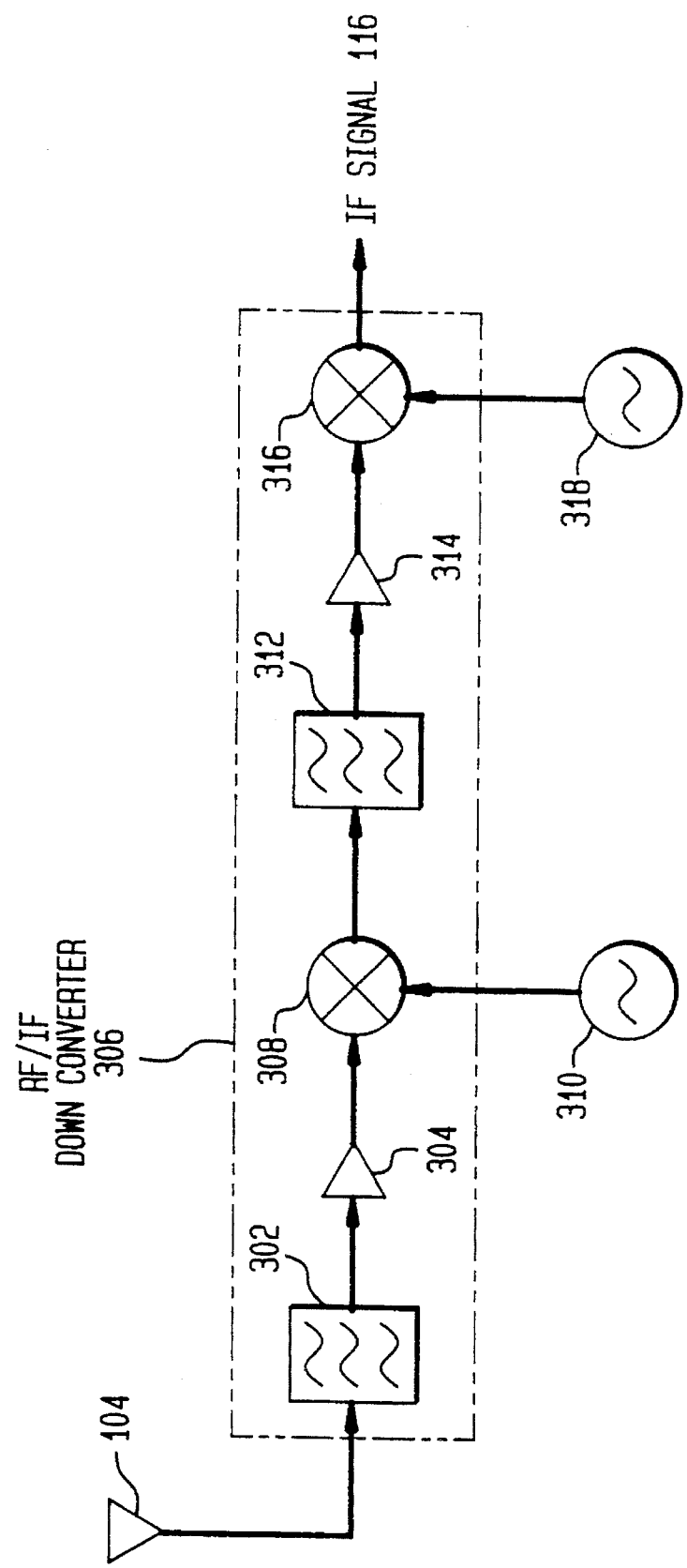
FIG. 3 is a block diagram of a RF/IF downconverter which is used in a communication receiver according to an embodiment of the present invention.

The received RF signal 105 is downconverted in a well known manner to an IF (intermediate frequency) signal 116 by a RF/IF downconverter 106 (an example IF signal 116 is shown for illustrative purposes in FIG. 2). The frequency of the IF signal 116 is approximately 70 MHz, but this could vary depending on the particular implementation and technology. The structure and operation of the RF/IF downconverter 106 are well known. Preferably, the RF/IF downconverter 106 includes a bandpass filter 108 which filters the received RF signal 105 to produce a filtered signal, and a low noise amplifier 110 which amplifies the filtered signal to produce an amplified signal. Depending on the frequency range of the RF signal 105, an alternate downconverter may be used, such as that shown in block diagram form in FIG. 3. This downconverter 306 includes two bandpass filters 302, 312, two low noise amplifiers 304, 314, and two mixers 308, 316 which receive signals from two local oscillators 310, 318. The detailed structure and operation of the downconverter 306 will be apparent to persons skilled in the relevant art.

A mixer 112 produces the IF signal 116 by mixing in a well known manner the amplified signal (which has a frequency which is substantially the same as the frequency of the received RF signal 105) with a signal generated by a local oscillator 114, wherein the signal generated by the local oscillator 114 has a frequency which is dependent on many factors, such as the particular technology used to implement the receiver 102. The bandpass filter 108, the low noise amplifier 110, the mixer 112, and the local oscillator 114 are all well known devices.

An all digital IF-to-baseband signal converter 118 receives and processes the IF signal 116. Specifically, the signal converter 118 digitizes the IF signal 116 to produce a plurality of N bit samples 148 (the number of samples 148 which are produced, and the rate at which they are produced, are described below). The signal converter 118 performs this digitizing function without the use of analog A/D (analog-to-digital) converters or other associated analog circuitry (such as analog I/Q mixers and/or analog baseband filters). Instead, the signal converter 118 performs this digitizing function using only digital components (it is noted that the signal converter 118 may use a limited number of analog components to perform minor functions). The signal converter 118 is described in greater detail below.

A frequency offset compensator, such as an N-bit adder 142, compensates for any frequency offset in the N bit samples 148. The N-bit adder 142 generates a plurality of corrected N bit samples 150, which are transferred to a decision device 144 (which is also called a "slicer"). The N-bit adder 142 is described in greater detail below.

The decision device 144 generates data bits 146 from the corrected N bit samples 150. The data bits 146 are processed by other components (not shown) in the receiver 102 in a well known manner.

The structure and operation of the decision device 144 are well known. Preferably, the decision device 144 operates as follows (this description of the decision device 144 begins with a brief discussion of the characteristics of the N bit samples 148).

Ideally, each of the N bit samples 148 generated by the signal converter 118 is equal to one of M discrete values. The value of M, and the values of the M discrete values, are implementation dependent. In a simple system, for example, M may equal 2 and the M discrete values may equal "0" and "1". However, due to physical imperfections (such as noise) of the transmission medium through which the RF signal was transmitted from the transmitter (not shown) to the receiver 102, each of the N bit samples 148 (and, correspondingly, each of the corrected N bit samples 150) may deviate from the M discrete values.

The decision device 144 analyzes each of the corrected N bit samples 150. Based on such analysis, the decision device 144 assigns one of the M discrete values to each of the corrected N bit samples 150. These assigned values are output from the decision device 146 as the data bits 146.

Preferably, a range is associated with each of the M discrete values. The decision device 144 assigns the M discrete values to the corrected N bit samples 150 by comparing each of the corrected N bit samples 150 to these ranges.

For example, assume that M equals 2 and the M discrete values equal "0" and "1". Also assume N is equal to 3. Further assume that a first range (in binary) of 000–100 is assigned to the discrete value "0", and a second range (in binary) of 101–111 is assigned to the discrete value "1". If a particular bit sample 148 is equal (in binary) to 011, then the decision device 144 would assign a discrete value of "0" to the bit sample 148. If another bit sample 148 is equal (in binary) to 110, then the decision device 144 would assign a discrete value of "1" to the bit sample 148.

The signal converter 118 shall now be described in detail.

As noted above, the signal converter 118 digitizes the IF signal 116 to produce the samples 148. According to the present invention, the signal converter 118 extracts phase and frequency information from the IF signal 116 to produce the samples 148. Preferably, the signal converter 118 extracts phase and frequency information from the IF signal 116 by computing the difference between the phase of the IF signal 116 and the phase of a local phase reference signal (this is further described below).

The signal converter 118 does not use amplitude information contained in the IF signal 116 to produce the samples 148 (this is in contrast to A/D converters, which digitize an analog signal based on the amplitude information contained therein). Consequently, the signal converter 148 of the present invention produces quasi-optimal performance results when information is encapsulated in the phase and/or frequency of signals. The signal converter 148 produces sub-optimal performance results when information is encapsulated jointly in the amplitude and phase of signals. However, the signal converter 148 is advantageous even in this latter case, since oftentimes the performance loss is more than offset by the many benefits of the present invention (discussed elsewhere in this document).

A bandpass filter 120 filters the IF signal 116 in a well known manner to achieve sufficient signal selectivity and lower signal dynamic range. The filtered IF signal is transferred to a hard-limiter amplifier 122 which converts in a well known manner the filtered IF signal to a hard limited IF signal 124, which is a square-wave signal (an example hard limited IF signal 124 is shown for illustrative purposes in FIG. 2). For many types of signals, such as PSK (phase shift keying) and FSK (frequency shift keying) modulated signals, all relevant information necessary for detection is contained in the zero-crossings of the hard-limited signal 124. The structure and operation of the bandpass filter 120 and the hard-limiter amplifier 122 are well known.

An N-bit counter 139 operates in parallel with the bandpass filter 120 and the hard-limiter amplifier 122. The N-bit counter 139 increments an N-bit count value from 0 to $2^N-1$ (equivalently, the counter 139 increments a count value from 0 to $2\pi$ radians in $2^N$ steps). This dynamically changing count value is shown in FIG. 1 as a phase counter output signal 134 (an example phase counter output signal 134 is shown for illustrative purposes in FIG. 2). In other words, at any time, the N-bit count value maintained by the counter 139 represents a sample of the phase counter output signal 134.

The N-bit counter 139 is clocked by a clocking reference signal that is generated and filtered by a reference oscillator 136 and a bandpass filter 138, respectively. The frequency $f_{ref}$ of the clocking reference signal generated by the reference oscillator 136 is preferably equal to $2^N f_{IF}$ where $f_{IF}$ is the frequency of the intermediate signal 116. Consequently, the count value of the counter 139 (which, as noted above, is equivalent to the phase counter output signal 134) linearly increases with time and overflows every $1/f_{IF}$ seconds.

An N-bit latch 132 stores (or latches) the N-bit count value generated by the counter 139 at times designated by a "synctime" signal 130, which is generated by a resynchronization (resync) circuit 126 (the resync circuit 126 and the synctime signal 130 are described below). These latched count values represent the plurality of N-bit samples 148 which are processed by the N-bit adder 142 and the decision device 144, as discussed above. An example synctime signal 130 is shown for illustrative purposes in FIG. 2.

The structure and operation of the N-bit counter 139, the reference oscillator 136, the bandpass filter 138, and the latch 132 will be apparent to persons skilled in the relevant art.

As noted above, the signal converter 118 extracts phase and frequency information from the IF signal 116 by computing the difference between the phase of the IF signal 116 and the phase of a local phase reference signal. According to the present invention, in this calculation, the IF signal 116 is represented by the hard limited IF signal 124, and the local phase reference signal is represented by the phase counter output signal 134. Thus, the signal converter 118 extracts phase and frequency information from the IF signal 116 by computing the difference between the phase of the hard limited IF signal 124 and the phase of the phase counter output signal 134.

The time difference between a falling edge of the phase counter output signal 134 (that is, when the count value maintained by the counter 139 overflows) and a subsequent rising edge of the hard limited IF signal 124 is a direct measure of the difference between the phase of the phase counter output signal 134 and the phase of the hard limited IF signal 124. According to the present invention, this phase difference is measured by having the latch 132 sample the count value of the counter 139 at a rising-edge of the hard-limited IF signal 124 following particular falling edges of the phase counter output signal 134, wherein such particular falling edges of the phase counter output signal 134 are selected by the resync circuit 126.

For example, one falling edge of the phase counter output signal 134 is shown in FIG. 2 as 202. A subsequent rising edge Of the hardlimited IF signal 124 is shown as 204. The count value maintained by the counter 139 at this rising edge 204 of the hard limited IF signal 124 is shown in FIG. 2 as 206. This count value represents the phase difference between the phase of the phase counter output signal 134 and the phase of the hard limited IF signal 124 at a time $T_A$.

As indicated above, the resync circuit 126 determines when the phase counter output signal 134 is sampled by the latch 132 (that is, when the latch 132 latches in the count value generated by the counter 139). The resync circuit 126 shall now be described.

The resync circuit 126 generates the synctime signal 130 from the hard limited IF signal 124 and a symbol rate clock signal 128, wherein the symbol rate clock signal 128 represents a re-generated transmitter clock signal (the manner in which the symbol rate clock signal 128 is generated by the receiver 102 is discussed below). Accordingly, the symbol rate clock signal 128 indicates the rate at which symbols in the IF signal 116 must be decoded by the receiver 102 (an example symbol rate clock signal 128 is shown for illustrative purposes in FIG. 2). In particular, rising edges in the symbol rate clock signal 128 preferably denote times when symbols in the IF signal 116 must be decoded by the receiver 102.

Instead of receiving the symbol rate clock signal 128, the resync circuit 126 may receive (in addition to the hard limited IF signal 124) a signal having a frequency which is a multiple (2, 4, 8, etc.) of the frequency of the symbol rate clock signal 128. The manner in which this signal could be generated will be apparent to persons skilled in the relevant art.

The resync circuit 126 generates the synctime signal 130 by monitoring for rising edges in the symbol rate clock signal 128 (as just noted, rising edges in the symbol rate clock signal 128 denote times when symbols in the IF signal 116 must be decoded by the receiver 102). When the symbol rate clock signal 128 goes high, the resync circuit 126 generates the synctime signal 130 having a rising edge coincident with the next rising edge in the hard limited IF signal 124.

The latch 132 samples the phase counter output signal 134 at every rising edge of the synctime signal 130. Thus, the count value latched into the latch 132 is equal to the time difference (relative to the frequency of the reference oscillator 136 and, correspondingly, the rate at which the counter 139 increments its count value) between a falling edge of the phase counter output signal 134 and a subsequent rising edge of the hard limited IF signal 124, after a rising edge of the symbol rate clock signal 128.

The resync circuit 126 maintains the synctime signal 130 at a high level for a predetermined period of time sufficient for the latch 132 to properly latch in the count value from the counter 139. After this predetermined period of time, the resync circuit 126 causes the synctime signal 130 to go to a low level.

The symbol rate clock signal 128 can be generated using any well known procedure. For example, the symbol rate clock signal 128 can be generated by feeding a received signal strength signal, which is also generated by the hard-limiter amplifier 122, to a phase locked loop circuit (not shown) in a well known manner. Alternatively, the symbol rate clock signal 128 can be generated by providing $T_s$ or $T_s/2$-spaced samples of the phase counter output signal 134 to a well known digital symbol-timing recovery circuit. $T_s$ is the symbol period. For example, if symbols are sent at 200 symbols/sec, $T_s=(1/200)$ seconds. Other ways to generate the symbol rate clock signal 128 will be apparent to persons skilled in the relevant art.

In an alternate embodiment, the phase counter output signal 134 is sampled at multiples of the symbol rate clock signal 128. This alternate embodiment is useful when the receiver 102 processes more than one sample per symbol.

As noted above, the frequency offset compensator (which is preferably implemented as an N-bit adder 142) compensates for any frequency offset in the N bit samples 148. The N-bit adder 142 shall now be described.

The N-bit adder 142 corrects for frequency offset by adding a frequency offset correction term 140, $\Delta f T_{samp}$, to each sample. 148. $\alpha f$ represents an estimate of the frequency offset, which is generated by the receiver 102 in a well known manner. Preferably, $\alpha f$ is generated using well-known AFC (automatic frequency control) techniques which use the input and output of the slicer 144. $T_{samp}$ represents the rate at which samples are produced out of the latch 132. The corrected N bit samples 150 generated by the N-bit adder 142 are processed by the decision device 144, as described above.

An all digital IF-to-baseband signal converter which does not employ analog-to-digital (A/D) converters or other associated analog circuitry has been discussed. Since it does not employ A/D converters or other associated analog circuitry, the present invention decreases power consumption, facilitates the design process (since digital designs are generally easier to test than analog designs), and decreases production costs (since there are no analog components to tune or match).

The signal converter of the present invention is operable with any frequency or phase modulation, such as frequency modulation (FM), multiple frequency shift keying (MFSK), and multiple phase shift keying (MPSK). Thus, the present invention is well suited for use in many communication applications. For example, the signal converter of the present invention can be used to implement digital cellular telephones and cordless telephones, wherein variations of MPSK and MFSK are used. Such portable telephones are used in the US (IS-54), Japanese (JDC), European (GSM) digital cellular systems, as well as in cordless systems such as CT-2, DECT, and PHP.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An intermediate frequency (IF) to baseband frequency signal converter for decoding an analog IF signal using phase information contained in the IF signal, comprising:

first means for generating an analog square wave signal from the IF signal;

second means for generating a local phase reference signal, said second means comprising:

a reference oscillator for generating a local phase clock signal having a frequency that is a function of a frequency of the IF signal, and a counter, coupled to said reference oscillator, for incrementing an N-bit count value in response to said local phase clock signal, wherein said bit count value represents the phase of said local phase reference signal; and third means, coupled to said first means and said second means, for determining at a particular sampling interval a phase difference between a phase of said analog square wave signal and a phase of said local phase reference signal, wherein said phase different represents a symbol which is part of a stream of data bits for use in a data processing system, said third means comprising:

a symbol rate clock circuit for generating a symbol rate clock signal having a frequency corresponding to a rate for decoding the IF signal, a resynchronization circuit, coupled to said first means and said symbol rate clock circuit, for generating a synchronization time signal as a function of said square wave signal and said symbol rate clock signal, and a latch, coupled to said counter and said resynchronization circuit, for sampling said N-bit count value maintained by said counter at sampling intervals designated by said synchronization time signal, wherein said N-bit count value samples represent differences in phase between said analog square wave signal and said local phase reference signal at respective sampling intervals.

2. The signal converter of claim 1, wherein said first means is a hard-limiter amplifier.

3. The signal converter of claim 1, wherein said frequency of said local phase clock signal is equal to $2^N f_{IF}$, where $f_{If}$ is equal to said IF signal frequency, and wherein said counter increments said N-bit count value from 0 to $2^N-1$, said N-bit count value overflowing to zero every $1/f_{If}$ seconds.

4. The signal converter of claim 1, wherein said resynchronization circuit comprises:

first detecting means for detecting a predetermined signal transition in said symbol rate clock signal;

second detecting means for detecting a predetermined signal transition in said square wave signal immediately following said detected signal transition in said symbol rate clock signal; and means, coupled to said first and second detecting means, for generating a predetermined signal transition in said synchronization time signal in response to said detections by said first and second detecting means, wherein said latch samples said N-bit count value maintained by said counter in response to each said predetermined signal transition in said synchronization time signal.

5. A method of decoding an analog intermediate frequency (IF) signal using phase information contained in the IF signal, comprising the steps of:

(a) generating an analog square wave signal from the IF signal;

(b) generating a local phase reference signal by generating a local phase clock signal having a frequency that is a function of a frequency of the IF signal and incrementing an N-bit count in response to said local phase clock signal, wherein said N-bit count value represents the phase of said local phase reference signal; and (c) determining at a particular sampling interval a phase difference between a phase of said analog square wave signal and a phase of said local phase reference signal by:

(1) generating a symbol rate clock signal having a frequency corresponding to a rate for decoding the IF signal, (2) generating asynchronization time signal as a function of said square wave signal and said symbol rate clock signal, and (3) sampling said N-bit count value at sampling intervals designated by said synchronization time signal, said N-bit count value samples representing differences in phase between said analog square wave signal and said local phase reference signal at respective sampling intervals, wherein said phase difference represents a symbol which is part of a stream of data bits for use in a data processing system.

6. The method of claim 1, wherein said frequency of said local phase clock signal is equal to $2^N f_{IF}$, where $f_{IF}$ is equal to said IF signal frequency, and wherein said; N-bit count value is incremented from 0 to $2^N-1$, said N-bit count value overflowing to zero every $1/f_{IF}$ seconds.

7. The method of claim 1, wherein the step of generating a synchronization time signal comprises:

detecting a predetermined signal transition in said symbol rate clock signal;

detecting a predetermined signal transition in said square wave signal immediately following said detected signal transition in said symbol rate clock signal; and generating a predetermined signal transition in said synchronization time signal in response to said detections, wherein said N-bit count value is sampled in response to each said predetermined signal transition in said synchronization time signal.

* * * * *